United States Patent
Liang et al.

(10) Patent No.: US 8,492,210 B2
(45) Date of Patent: Jul. 23, 2013

(54) TRANSISTOR, SEMICONDUCTOR DEVICE COMPRISING THE TRANSISTOR AND METHOD FOR MANUFACTURING THE SAME

(75) Inventors: Qingqing Liang, Beijing (CN); Huilong Zhu, Poughkeepsie, NY (US); Huicai Zhong, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 93 days.

(21) Appl. No.: 13/144,906

(22) PCT Filed: Feb. 25, 2011

(86) PCT No.: PCT/CN2011/000305
§ 371 (c)(1),
(2), (4) Date: Aug. 24, 2011

(87) PCT Pub. No.: WO2012/079272
PCT Pub. Date: Jun. 21, 2012

(65) Prior Publication Data
US 2012/0153393 A1   Jun. 21, 2012

(30) Foreign Application Priority Data
Dec. 17, 2010   (CN) .......................... 2010 1 0610932

(51) Int. Cl.
*H01L 21/84* (2006.01)
(52) U.S. Cl.
USPC ........... 438/157; 438/176; 438/195; 438/283; 438/588; 257/250; 257/331; 257/366; 257/E21.179; 257/E21.421; 257/E21.623; 257/E21.637; 257/E29.264

(58) Field of Classification Search
USPC .......... 438/157, 176, 195, 283, 588; 257/250, 257/331, E21.179, 366, E21.421, E21.623, 257/E21.637, E29.264
See application file for complete search history.

(56) References Cited

U.S. PATENT DOCUMENTS
6,664,598 B1   12/2003   Dennard et al. .............. 257/347
2005/0253197 A1*   11/2005   Tokushige .................... 257/347
(Continued)

FOREIGN PATENT DOCUMENTS
CN   1487597 A   4/2004
JP   9162417 A   6/1997

*Primary Examiner* — Kimberly Rizkallah
*Assistant Examiner* — Maria Ligai
(74) *Attorney, Agent, or Firm* — Martine Penilla Group, LLP

(57) ABSTRACT

The invention relates to a transistor, a semiconductor device comprising the transistor and manufacturing methods for the transistor and the semiconductor device. The transistor according to the invention comprises: a substrate comprising at least a base layer, a first semiconductor layer, an insulating layer and a second semiconductor layer stacked sequentially; a gate stack formed on the second semiconductor layer; a source region and a drain region located on both sides of the gate stack respectively; a back gate comprising a back gate dielectric and a back gate electrode formed by the insulating layer and the first semiconductor layer, respectively; and a back gate contact formed on a portion of the back gate electrode. The back gate contact comprises an epitaxial part raised from the surface of the back gate electrode, and each of the source region and the drain region comprises an epitaxial part raised from the surface of the second semiconductor layer. As compared to a conventional transistor, the manufacturing process of the transistor of the invention is simplified and the cost of manufacture is reduced.

26 Claims, 8 Drawing Sheets

U.S. PATENT DOCUMENTS

| | | | |
|---|---|---|---|
| 2007/0075317 A1 | 4/2007 | Kato et al. | 257/74 |
| 2008/0182380 A1 | 7/2008 | Oka | 438/425 |
| 2010/0084709 A1* | 4/2010 | Tsuchiya et al. | 257/347 |
| 2010/0176482 A1* | 7/2010 | Dennard et al. | 257/506 |

* cited by examiner

TRANSISTOR, SEMICONDUCTOR DEVICE COMPRISING THE TRANSISTOR AND METHOD FOR MANUFACTURING THE SAME

CROSS REFERENCE

This application is a Section 371 National Stage Application of International Application No. PCT/CN2011/000305, filed on Feb. 25, 2011, which claims priority to CN 201010610932.X, filed on Dec. 17, 2010, the entire contents of which are incorporated herein by reference in their entirety.

FIELD OF THE INVENTION

The invention relates to a transistor and a semiconductor device comprising the transistor. More specifically, the invention relates to a transistor comprising a back gate and a semiconductor device comprising the transistor. The invention also relates to methods for manufacturing the transistor and the semiconductor device.

BACKGROUND OF THE INVENTION

Transistors are commonly used elements in integrated circuits. In a CMOS circuit formed by CMOS technology, an N-channel transistor and a P-channel transistor are usually included.

With the development of the semiconductor technology, a transistor comprising a back gate appears. Compared with a transistor comprising only a front gate or a gate stack, the transistor including a back gate has improved performance. A back gate contact realizing a desired electrical connection between the back gate and the other components in the circuit is one of the key components in the circuit.

In current semiconductor integrated circuits, SOI (Semiconductor-On-Insulator) technology gets more and more widely used. In a device formed by the SOI technology, in particular the ultra-thin SOI (UTSOI) technology, the back gate contact can help to control the threshold voltage and the short channel effect (SCE). Further, the back gate contact is also considered as a key component for the next generation of CMOS technology.

However, in the existing manufacturing flow for the semiconductor device or integrated circuits, the formation of the back gate contact may damage the structures already formed. For example, in the process flow of forming a device by the SOI technology, the formation of the back gate contact will probably damage a buried insulating layer or a buried oxide (BOX) layer in an SOI substrate. Hence, an additional protective layer (e.g., a nitride layer) is needed. Furthermore, the formation of the back gate contact requires an additional polysilicon filling. This makes the manufacturing process become particularly complex, and meanwhile increases the cost of manufacture.

SUMMARY OF THE INVENTION

The invention solves the above problems in the prior art.

According to an aspect of the invention, a transistor is provided. As compared to a conventional transistor, the formation of a back gate contact of the present transistor will not damage the structures already formed and there is no need for an additional protective layer and additional polysilicon filling, thereby greatly simplifying the manufacturing process and significantly reducing the cost of manufacture.

The transistor according to the invention may comprise: a substrate comprising at least a base layer, a first semiconductor layer, an insulating layer and a second semiconductor layer stacked sequentially; a gate stack formed on the second semiconductor layer; a source region and a drain region located on both sides of the gate stack, respectively; a back gate comprising a back gate dielectric and a back gate electrode formed by the insulating layer and the first semiconductor layer, respectively; and a back gate contact formed on a portion of the back gate electrode, wherein the back gate contact comprises an epitaxial part raised from the surface of the back gate electrode, and each of the source region and the drain region comprises an epitaxial part raised from the surface of the second semiconductor layer.

According to another aspect of the invention, a semiconductor device is provided. The semiconductor device may comprise a plurality of the transistors.

In an embodiment, the semiconductor device may comprise at least one N-type field effect transistor (NFET) and at least one P-type field effect transistor (PFET). The at least one N-type field effect transistor and the at least one P-type field effect transistor may be isolated from each other by isolators. The isolator may be a shallow trench isolation, for example.

According to yet another aspect, a method for manufacturing a transistor is provided. The method forms an epitaxial part raised from the surface of a back gate electrode using an epitaxy process and thus forms a back gate contact. As compared to a conventional method, the formation of a back gate contact in such a manufacturing method will not damage the structures already formed and there is no need for an additional protective layer and additional polysilicon filling, thereby greatly simplifying the manufacturing process and significantly reducing the cost of manufacture.

The method for manufacturing a transistor according to the invention may comprise: providing a substrate, the substrate comprising at least a base layer, a first semiconductor layer, an insulating layer and a second semiconductor layer stacked sequentially, wherein a back gate electrode and a back gate dielectric of a back gate of the transistor are formed by the first semiconductor layer and the insulating layer, respectively; forming a gate stack on the second semiconductor layer; selectively removing a portion of the second semiconductor layer and a portion of the insulating layer to expose a portion of the back gate electrode; forming a source region and a drain region on both sides of the gate stack, respectively; and performing a selective epitaxy to the exposed portion of the back gate electrode, the source region and the drain region to form an epitaxial part raised from the surface of the back gate electrode, so as to form a back gate contact, such that each of the source region and the drain region comprises an epitaxial part raised from the surface of the second semiconductor layer.

According to still another aspect of the invention, a method for manufacturing a semiconductor device is provided, the semiconductor device may comprise a first transistor and a second transistor, the method may comprise: providing a substrate, the substrate comprising at least a base layer, a first semiconductor layer, an insulating layer and a second semiconductor layer stacked sequentially, wherein a first back gate electrode of a first back gate of the first transistor and a second back gate electrode of a second back gate of the second transistor are formed by the first semiconductor layer, and a first back gate dielectric of the first back gate of the first transistor and a second back gate dielectric of the second back gate of the second transistor are formed by the insulating layer; forming an isolator for isolating the first transistor and the second transistor from each other; forming a first gate stack and a second gate stack on the second semiconductor layer; selectively removing a portion of the second semiconductor layer and a portion of the insulating layer to expose a portion of the first back gate electrode and a portion of the second back gate electrode; forming a first source region and a first drain region on both sides of the first gate stack, respectively, and forming a second source region and a second drain region on both sides of the second gate stack, respectively; and performing a selective epitaxy to the exposed portion of the first back gate electrode, the exposed portion of the second back gate electrode, the first source region, the first drain region, the second source region and the second drain region, thereby forming an epitaxial part raised from the surface of the first back gate electrode and thus forming a first back gate contact, as well as forming an epitaxial part raised from the surface of the second back gate electrode and thus forming a second back gate contact, such that each of the first source region, the first drain region, the second source region and the second drain region comprises an epitaxial part raised from the surface of the second semiconductor layer.

BRIEF DESCRIPTION OF THE DRAWINGS

These and other objects, features and advantages of the invention will become more apparent from the following detailed description of the exemplary embodiments of the invention with reference to the accompanying drawings. In the drawings.

DETAILED DESCRIPTION OF THE INVENTION

Figure 1A:
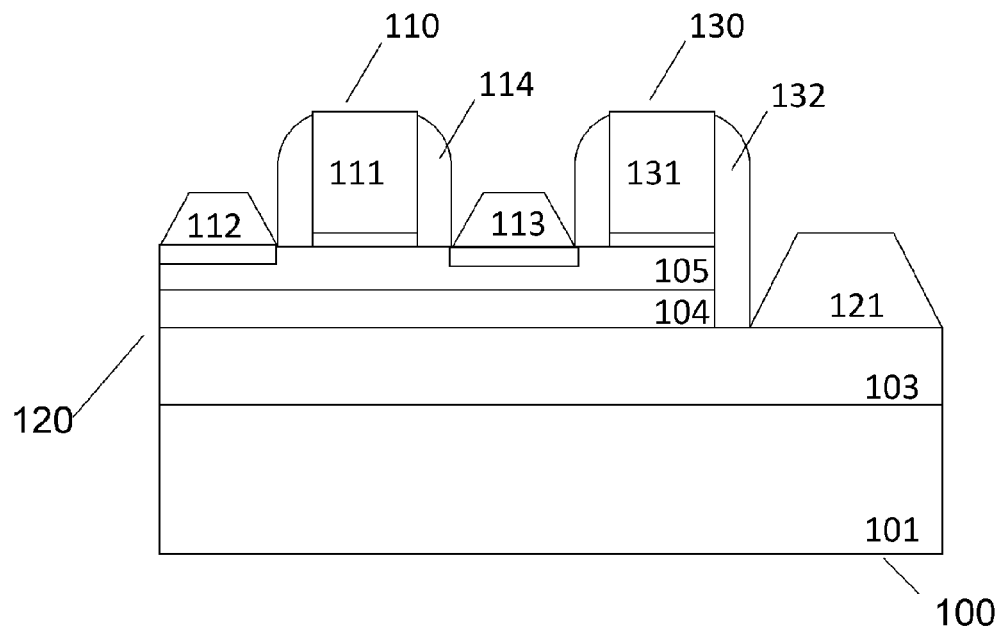
FIG. 1A shows a schematic cross section view of a transistor according to an exemplary embodiment of the invention.

The exemplary embodiments of the invention will be described in detail with reference to the accompanying drawings hereinafter. The drawings are schematic and not drawn to scale, and just for illustrating the embodiments of the invention and are not intended to limit the protective scope of the invention. In the drawings, like reference numerals denote identical or similar components. For making the technical solution of the invention clearer, process steps and structures of a device well known in the art are omitted herein.

First, a transistor according to an exemplary embodiment of the invention is described in detail with reference to FIGS. 1A and 1B.

FIG. 1A shows a schematic cross section view of a transistor according to an exemplary embodiment of the invention. As shown in FIG. 1A, a substrate 100 for forming a transistor 110 may comprise a base layer 101, a first semiconductor layer 103, an insulating layer 104 and a second semiconductor layer 105 stacked sequentially. As an example, the insulating layer 104 of the substrate 100 may comprise, but not limited to, a material selected from a group consisting of $SiO_2$, $Si_3N_4$, or any combination thereof; the first semiconductor layer 103 may comprise, but not limited to, a material selected from a group consisting of Si, SiGe, SiC, Ge, GaAs, InP, or any combination thereof; and the second semiconductor layer 105 may comprise, but not limited to, a material selected from a group consisting of Si, SiGe, SiC, Ge, GaAs, InP, or any combination thereof. It should be noted that the number of the semiconductor layers and the number of the insulating layer comprised in the substrate 100 are not limited to those shown in FIG. 1A. The substrate may comprise more semiconductor layers or insulating layers. For example, besides the layers shown in FIG. 1A, the substrate 100 may also comprise a further insulating layer located between the base layer 101 and the first semiconductor layer 103.

A gate stack 111 of the transistor 110 is formed on the second semiconductor layer 105 of the substrate 100. In an embodiment, the gate stack 111 may comprise a gate dielectric and a gate electrode formed on the gate dielectric. The gate dielectric may, for example, comprise a material selected from a group consisting of $SiO_2$, $Si_3N_4$, $HfO_2$, or any combination thereof. The gate electrode may, for example, comprise a material selected from a group consisting of Al, polysilicon, Ti, or any combination thereof. Optionally, a spacer 114 may be formed on sidewalls of the gate stack 111. The spacer 114 may, for example, comprise a nitride, e.g., $Si_3N_4$. The spacer 114 may also comprise an oxide, e.g., $SiO_2$.

A source region 112 and a drain region 113 of the transistor 110 are located on both sides of the gate stack 111, respectively. The transistor 110 further comprises a back gate 120. The back gate 120 may comprise a back gate dielectric and a back gate electrode. In the shown embodiment, the back gate dielectric and the back gate electrode of the back gate 120 are formed by the insulating layer 104 and the first semiconductor layer 103, respectively. A back gate contact 121 is formed on a portion of the back gate electrode formed by the first semiconductor layer 103. In the exemplary embodiment shown in FIG. 1A, the back gate contact 121 comprises an epitaxial part raised from the surface of the back gate electrode. In addition, each of the source region 112 and the drain region 113 comprises an epitaxial part raised from the surface of the second semiconductor layer 105.

Optionally, a dummy gate 130 may further be formed on the substrate 100. The dummy gate 130 is used for isolating the back gate contact 121 from the source region and the drain region of the transistor. The dummy gate 130 may comprise a dummy gate stack 131. In an example, the dummy gate stack 131 may comprise a dummy gate dielectric and a dummy gate electrode formed on the dummy gate dielectric. The dummy gate dielectric may, for example, comprise a material selected from a group consisting of $SiO_2$, $Si_3N_4$, $HfO_2$, or any combination thereof. The dummy gate electrode may, for example, comprise a material selected from a group consisting of Al, polysilicon, Ti, or any combination thereof. Optionally, a spacer 132 may be formed on sidewalls of the dummy gate stack 131. The spacer 132 may, for example, comprise a nitride, e.g., $Si_3N_4$. The spacer 132 may also comprise an oxide, e.g., $SiO_2$.

Figure 1B:
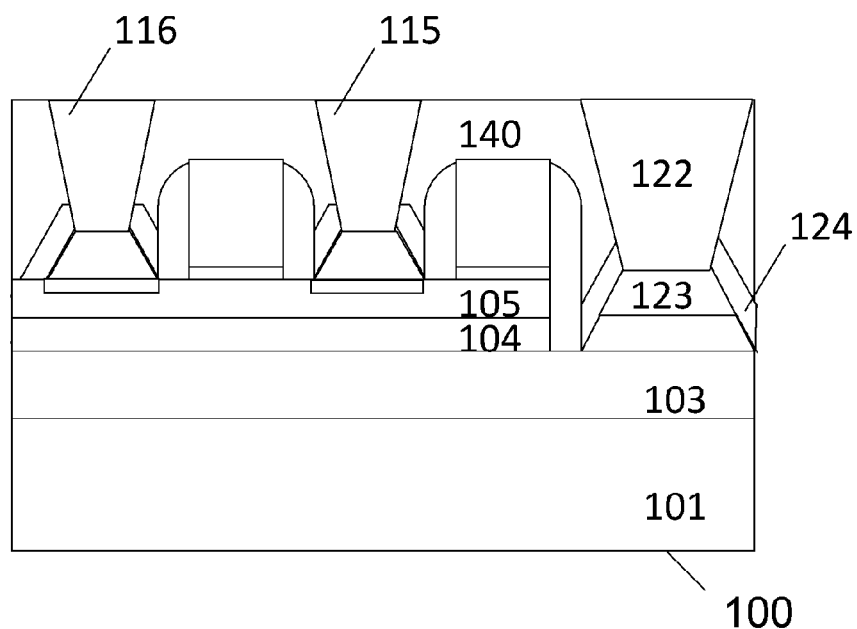
FIG. 1B shows a schematic view of the transistor in FIG. 1A after forming a contact.

FIG. 1B shows a schematic cross section view of a transistor according to another exemplary embodiment of the invention. More specifically, FIG. 1B shows a schematic view of the transistor in FIG. 1A after forming a contact. Except for a contact plug, the structure of the transistor shown in FIG. 1B is substantially the same as the transistor in FIG. 1A.

As shown in FIG. 1B, a back-gate contact plug 122 may further be formed on the back gate contact. In the exemplary embodiment shown in FIG. 1B, the back-gate contact plug 122 may be formed in a passivation layer 140 above the back gate contact.

Optionally, the epitaxial part raised from the back gate contact may comprise a metal silicide 123. The metal silicide 123 may be formed in a portion of the epitaxial part raised from the back gate contact. Optionally, a liner 124 may further be formed on the outer surface of the epitaxial part raised from the back gate contact. The liner 124 may, for example, comprise a nitride.

Optionally, a source region contact plug 116 and a drain region contact plug 115 may be formed on the epitaxial part raised from the source region and the epitaxial part raised from the drain region of the transistor, respectively. In addition, the epitaxial part raised from the source region and the epitaxial part raised from the drain region may also comprise a metal silicide. Moreover, a liner may be optionally formed on the outer surface of the epitaxial part raised from the source region and the outer surface of the epitaxial part raised from the drain region, respectively.

In the following, a semiconductor device according to an exemplary embodiment of the invention is described in detail with reference to FIGS. 2A and 2B.

Figure 2A:
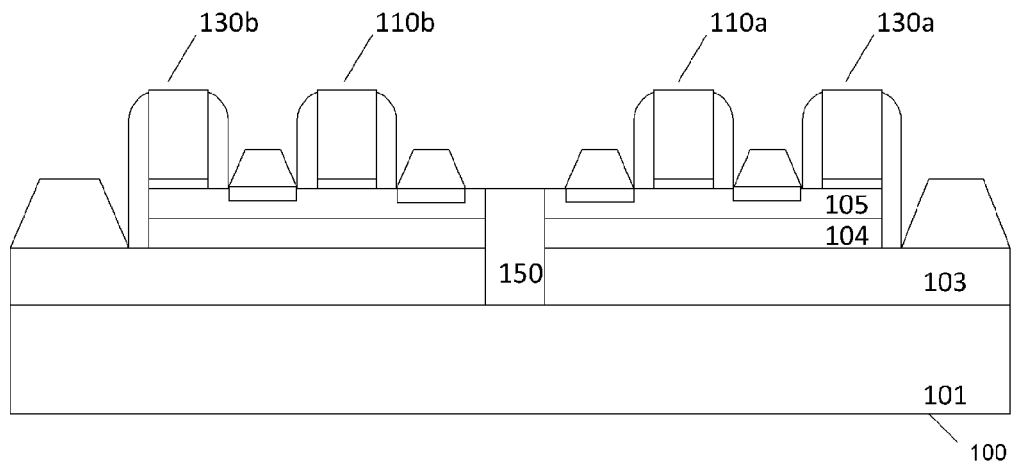
FIG. 2A shows a schematic cross section view of a semiconductor device according to an exemplary embodiment of the invention.

FIG. 2A shows a schematic cross section view of a semiconductor device according to an exemplary embodiment of the invention.

As shown in FIG. 2A, a semiconductor device according to an exemplary embodiment of the invention comprises a transistor 110a and a transistor 110b. The transistor 110a and the transistor 110b may be the transistor as shown in FIG. 1A. Herein, the transistor 110a and the transistor 110b may be isolated from each other by an isolator 150. The isolator 150 may, for example, be a shallow trench isolation (STI) or an LOCOS. The shallow trench isolation may, for example, cross through the second semiconductor layer 105, the insulating layer 104 and the first semiconductor layer 103. The depth of the shallow trench isolation may for example be 100 nm to 1000 nm.

In an example, one of the transistor 110a and the transistor 110b may be an N-type field effect transistor (NFET), while the other of the transistor 110a and the transistor 110b may be a P-type field effect transistor (PFET). The N-type field effect transistor and the P-type field effect transistor may be formed by the CMOS technology, for example.

Optionally, the semiconductor device shown in FIG. 2A may further comprise a dummy gate 130a and a dummy gate 130b. The dummy gates 130a and 130b are used for isolating the back gate contact from the source region and the drain region of the transistor.

It should be noted that, while two transistors are shown in FIG. 2A, this is only an example and does not limit the invention. The number of transistors comprised in the semiconductor device of the invention is not limited to two. The number of transistors comprised in the semiconductor device may be selected as desired by those skilled in the art.

Figure 2B:
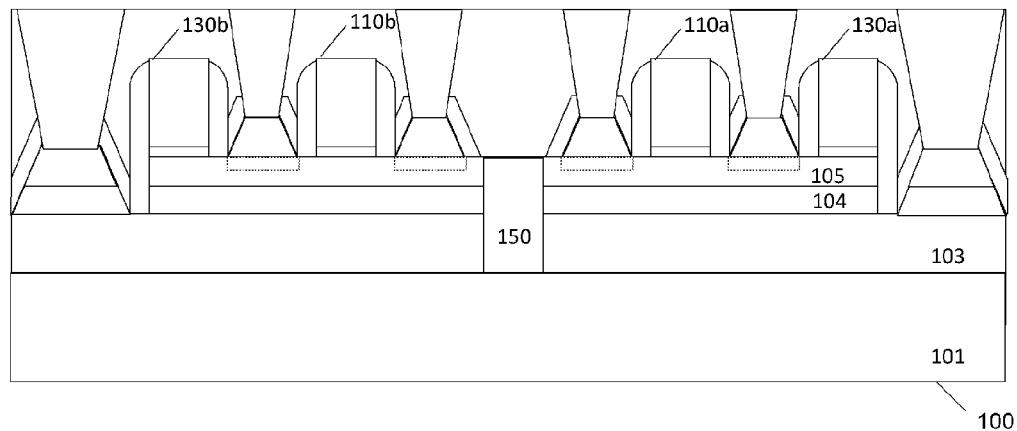
FIG. 2B shows a schematic view of the semiconductor device in FIG. 2A after forming a contact.

FIG. 2B shows a schematic cross section view of a semiconductor device according to another exemplary embodiment of the invention. More specifically, FIG. 2B shows a schematic view of the semiconductor device in FIG. 2A after forming a contact.

As shown in FIG. 2B, a semiconductor device according to another exemplary embodiment of the invention comprises a transistor 110a and a transistor 110b. The transistor 110a and the transistor 110b may be the transistor as shown in FIG. 1B. Herein, the transistor 110a and the transistor 110b may be isolated from each other by an isolator 150. The isolator 150 may for example be a shallow trench isolation (STI) or an LOCOS. The shallow trench isolation may, for example, cross through the second semiconductor layer 105, the insulating layer 104 and the first semiconductor layer 103. The depth of the shallow trench isolation may, for example, be in the range of about 100 nm to 1000 nm.

In an example, one of the transistor 110a and the transistor 110b may be an N-type field effect transistor (NFET), while the other of the transistor 110a and the transistor 110b may be a P-type field effect transistor (PFET). The N-type field effect transistor and the P-type field effect transistor may be formed by CMOS technology, for example.

Optionally, the semiconductor device shown in FIG. 2B may further comprise a dummy gate 130a and a dummy gate 130b. The dummy gates 130a and 130b are used for isolating the back gate contacts from the source regions and the drain regions of the transistors.

It should be noted that two transistors are shown in FIG. 2B. However, this is only an example and does not limit the invention. The number of transistors comprised in the semiconductor device of the invention is not limited to two. The number of transistors comprised in the semiconductor device may be selected as desired by those skilled in the art.

In the following, a method for manufacturing a transistor according to an exemplary embodiment of the invention is described in detail with reference to FIGS. 3A to 3F.

Figure 3A:
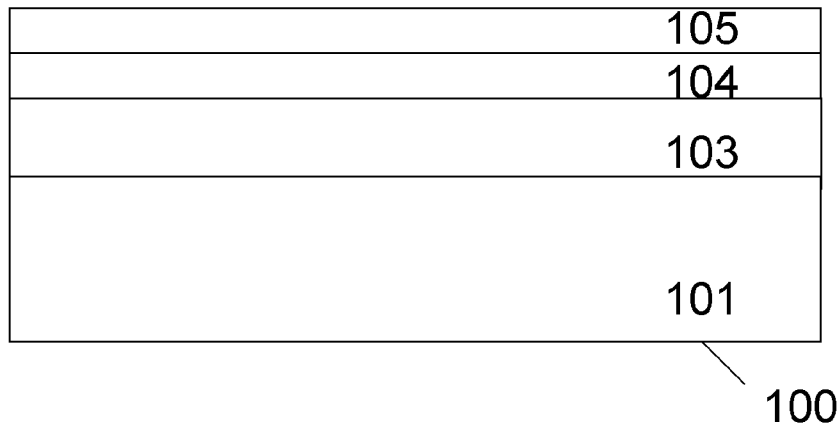
FIG. 3A shows a first step of a method for manufacturing a transistor according to an exemplary embodiment of the invention, in which a substrate is provided.

FIG. 3A shows a first step of a method for manufacturing a transistor according to an exemplary embodiment of the invention. In this step, a substrate 100 is provided. The substrate 100 may comprise a base layer 101, a first semiconductor layer 103, an insulating layer 104 and a second semiconductor layer 105 stacked sequentially. Herein, the first semiconductor layer 103 and the insulating layer 104 form a back gate electrode and a back gate dielectric of a back gate of the transistor, respectively.

As an example, the insulating layer 104 of the substrate 100 may comprise, but not limited to, a material selected from a group consisting of $SiO_2$, $Si_3N_4$, or any combination thereof; the first semiconductor layer 103 may comprise, but not limited to, a material selected from a group consisting of Si, SiGe, SiC, Ge, GaAs, InP, or any combination thereof; the second semiconductor layer 105 may comprise, but not limited to, a material selected from a group consisting of Si, SiGe, SiC, Ge, GaAs, InP, or any combination thereof. It should be noted that, the number of the semiconductor layers and the number of the insulating layer comprised in the substrate 100 are not limited to those shown in FIG. 3A. The substrate may comprise more semiconductor layers or insulating layers. For example, besides the layers shown in FIG. 3A, the substrate 100 may also comprise a further insulating layer located between the base layer 101 and the first semiconductor layer 103.

Figure 3B:
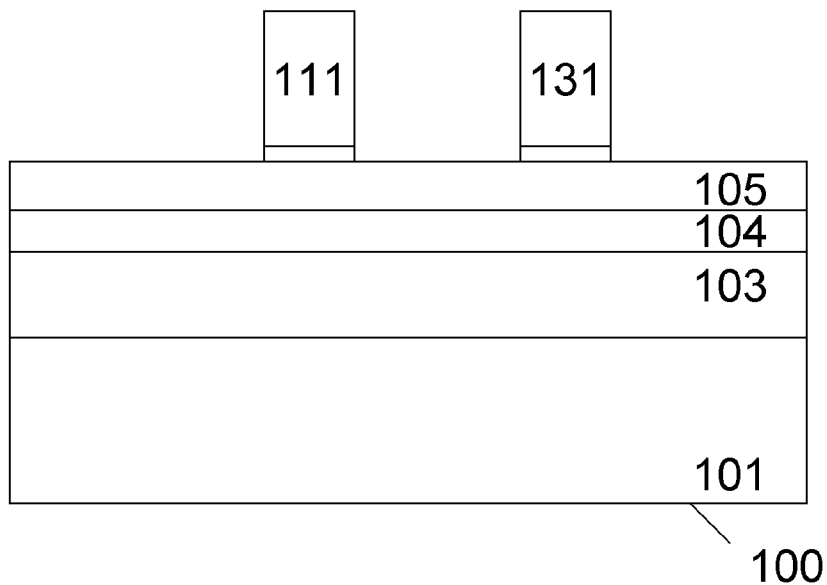
FIG. 3B shows a second step of the method for manufacturing the transistor according to the exemplary embodiment of the invention, by which a patterned gate stack is formed.

FIG. 3B shows a second step of the method for manufacturing the transistor according to the exemplary embodiment of the invention. As shown in FIG. 3B, a gate stack 111 is formed on the second semiconductor layer 105.

Optionally, in this step, a dummy gate stack 131 may further be formed on the second semiconductor layer 105. Forming a dummy gate stack in the same step of forming a gate stack may simplify the process of isolating the back gate contact from the source region and the drain region of the transistor by forming a dielectric structure (for example, a shallow trench isolation) in a conventional technology.

In an example, the gate stack 111 and the dummy gate stack 131 may be formed by depositing a dielectric layer and an electrode layer on the second semiconductor layer 105 of the substrate 100 sequentially, and then patterning the deposited electrode layer and dielectric layer. However, the invention is not limited to this. The gate stack 111 and the dummy gate stack 131 may also be formed by other methods known to those skilled in the art.

Figure 3C:
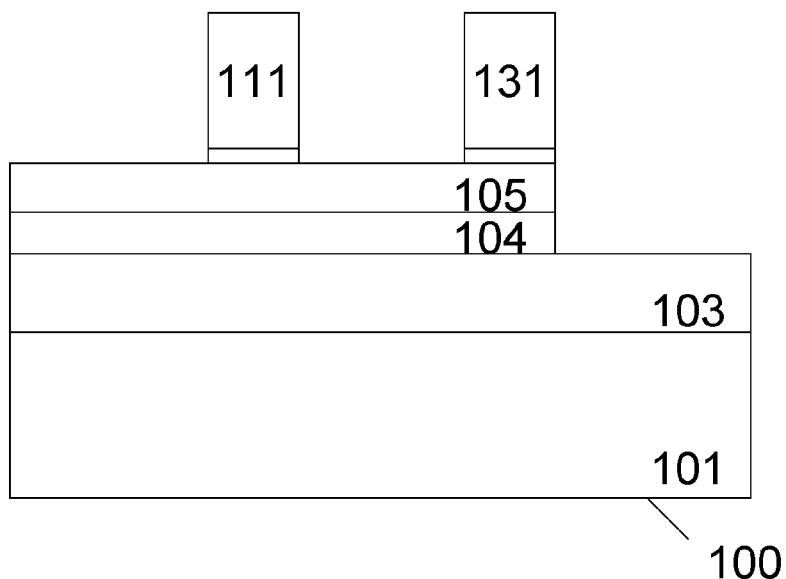
FIG. 3C shows a third step of the method for manufacturing the transistor according to the exemplary embodiment of the invention, by which a portion of a back gate electrode is exposed.

FIG. 3C shows a third step of the method for manufacturing the transistor according to the exemplary embodiment of the invention. As shown in FIG. 3C, a portion of the second semiconductor layer 105 and a portion of the insulating layer 104 are selectively removed to expose a portion of the back gate electrode formed by the first semiconductor layer 103. As will be described in the following, a back gate contact will be formed on the exposed portion of the back gate electrode in subsequent steps.

In an example, a portion of the second semiconductor layer 105 and a portion of the insulating layer 104 may be selectively removed by etching. For example, a portion of the back gate electrode formed by the first semiconductor layer 103 may be exposed by masking the portion of the second semiconductor layer 105 and the insulating layer 104 that need not be removed using a mask, performing an exposure process, and then etching away the portion which is subjected to the exposure process. However, the invention is not limited to this. Other methods known to those skilled in the art may be used to selectively remove a portion of the second semiconductor layer 105 and a portion of the insulating layer 104 to expose a portion of the back gate electrode.

Figure 3D:
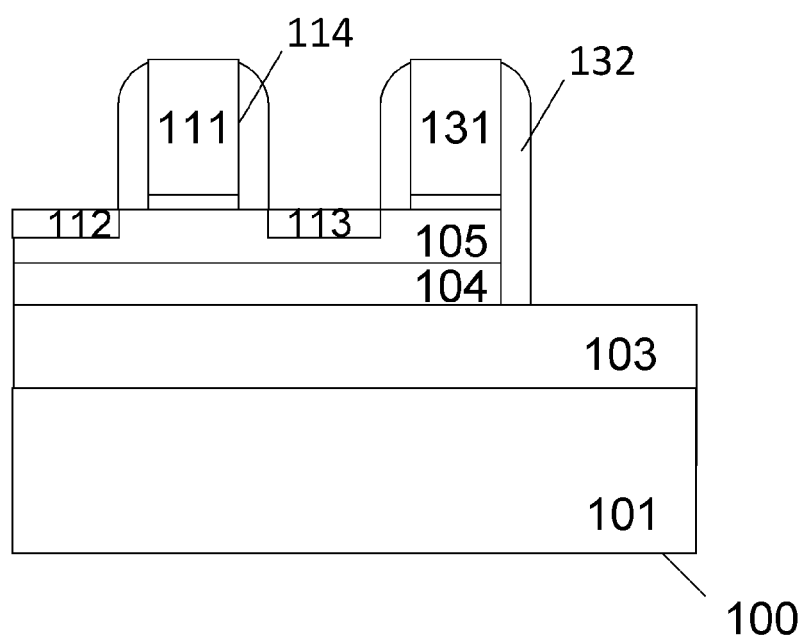
FIG. 3D shows a fourth step of the method for manufacturing the transistor according to the exemplary embodiment of the invention, by which a source region and a drain region of the transistor are formed.

FIG. 3D shows a fourth step of the method for manufacturing the transistor according to the exemplary embodiment of the invention. In this step, a source region 112 and a drain region 113 are formed on both sides of the gate stack 111, respectively.

Optionally, a spacer 114 may be formed on sidewalls of the gate stack 111 before forming the source region 112 and the drain region 113. The spacer 114 may comprise a nitride, e.g., $Si_3N_4$. The spacer 114 may also comprise an oxide, e.g., $SiO_2$. In an example in which a dummy gate stack 131 is formed on the second semiconductor layer 105, a spacer 132 may also be formed on sidewalls of the dummy gate stack 131 at the same time when forming the spacer 114.

In an example, the source region 112 and the drain region 113 may be formed by implanting ions into the second semiconductor layer 105 on both sides of the gate stack 111. For an N-channel transistor, such as an NFET, the ions implanted may, for example, be arsenic or phosphor, and for a P-channel transistor, such as a PFET, the ions implanted may, for example, be boron. However, the invention is not limited to this. The source region 112 and the drain region 113 may also be formed by other methods known to those skilled in the art.

Figure 3E:
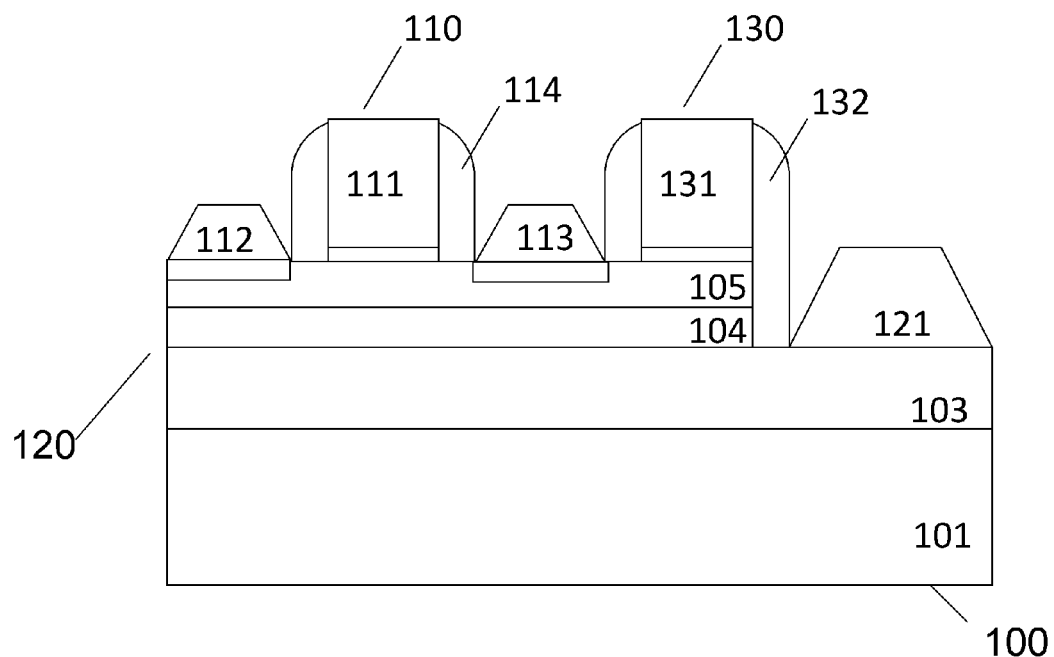
FIG. 3E shows a fifth step of the method for manufacturing the transistor according to the exemplary embodiment of the invention, in which a selective epitaxy is performed to the exposed portion of the back gate electrode, the source region and the drain region.

FIG. 3E shows a fifth step of the method for manufacturing the transistor according to the exemplary embodiment of the invention. In this step, a selective epitaxy is performed to the exposed portion of the back gate electrode formed by the first semiconductor 103, the source region 112 and the drain region 113, to form an epitaxial part raised from the surface of the back gate electrode and thus form a back gate contact 121, such that each of the source region 112 and the drain region 113 comprises an epitaxial part raised from the surface of the second semiconductor layer 105. In other words, the source region, the drain region and the exposed portion of the back gate electrode of the transistor are raised by the selective epitaxy.

A transistor according to the exemplary embodiment of the invention is formed by the manufacturing method shown in FIGS. 3A to 3E. The transistor comprises a back gate contact formed on a portion of the back gate electrode, and the back gate contact comprises an epitaxial part raised from the surface of the back gate electrode. In such a manufacturing method, the formation of the back gate contact will not damage the formed structures (e.g., the buried insulating layer in the substrate), and it is unnecessary to form an additional protective layer and an additional polysilicon filling. This greatly simplifies the manufacturing process and significantly reduces the cost of manufacture.

Figure 3F:
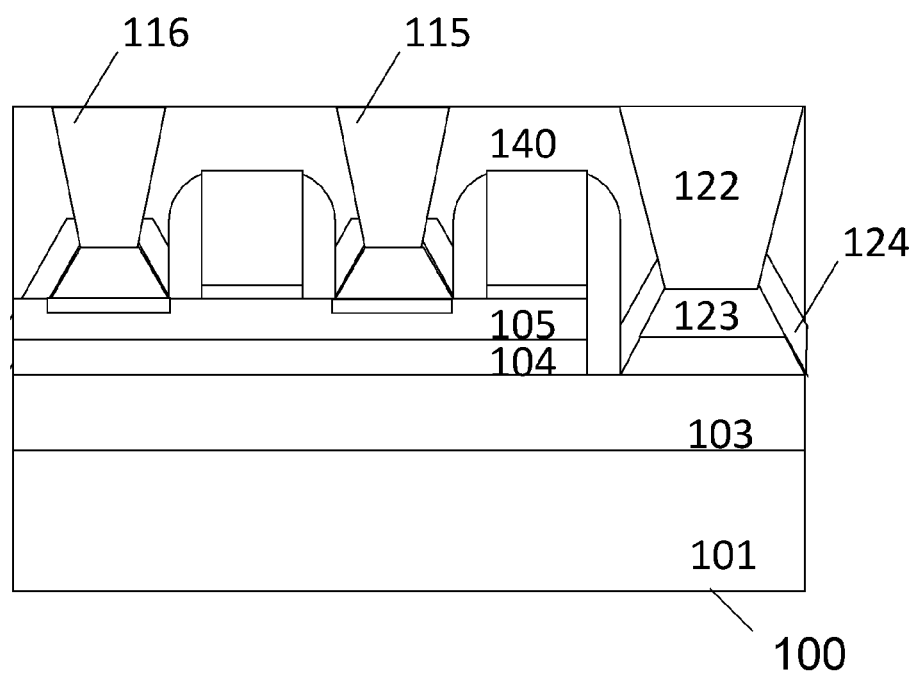
FIG. 3F shows an optional sixth step of the method for manufacturing the transistor according to the exemplary embodiment of the invention, in which a back-gate contact plug is formed.

Optionally, the method for manufacturing the transistor according to the exemplary embodiment of the invention may further comprise a step shown in FIG. 3F. In this step, a back-gate contact plug 122 is further formed on the back gate contact 121. In an example, the back-gate contact plug 122 may be formed in a passivation layer 140 above the back gate contact. The back-gate contact plug 122 may, for example, comprise metals. For example, the back-gate contact plug may comprise tungsten, copper, etc.

Optionally, before forming the back-gate contact plug 122, a metal silicide 123 may be formed in the raised epitaxial part of the back gate contact. The metal silicide 123 may, for example, be formed in a portion of the raised epitaxial part of the back gate contact. Furthermore, optionally, a liner 124 may further be formed on the outer surface of the raised epitaxial part of the back gate contact. The liner 124 may, for example, comprise a nitride.

Optionally, in the step shown in FIG. 3F, a source region contact plug 116 and a drain region contact plug 115 may further be formed on the raised epitaxial part of the source region and the raised epitaxial part of the drain region of the transistor, respectively. In addition, the raised epitaxial part of the source region and the raised epitaxial part of the drain region may also comprise a metal silicide. Moreover, a liner may be optionally formed on the outer surface of the raised epitaxial part of the source region and the outer surface of the raised epitaxial part of the drain region.

In an example, the back-gate contact plug, as well as the source region contact plug and the drain region contact plug may be formed in the following manner. Firstly, a metal silicide is formed in the raised epitaxial part of the back gate contact, the raised epitaxial part of the source region and the raised epitaxial part of the drain region, respectively. After that, a liner formed by, for example, a nitride is deposited on the outer surface of the raised epitaxial part of the back gate contact, the outer surface of the raised epitaxial part of the source region and the outer surface of the raised epitaxial part of the drain region. Then, a low-temperature thermal oxidation (LTO) is performed at a temperature in the range of about 0-500° C. to form a passivation layer. Subsequently, the formed passivation layer is planarized by a planarization process such as Chemical Mechanical Polishing (CMP). After that, a contact hole is formed at the position in the planarized passivation layer where a contact plug is to be formed. Finally, the contact hole is filled with plug materials such as tungsten, thereby forming the back-gate contact plug as well as the source region contact plug and the drain region contact plug. It should be noted that the invention is not limited to the above example. The back-gate contact plug as well as the source region contact plug and the drain region contact plug may also be formed by other methods known to those skilled in the art.

In the following, a method for manufacturing a semiconductor device according to an exemplary embodiment of the invention is described in detail with reference to FIGS. 4A to 4F.

Figure 4A:
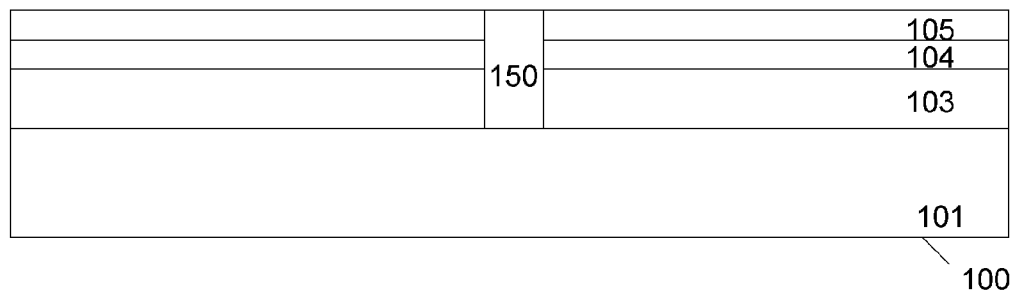
FIG. 4A shows a first step of a method for manufacturing a semiconductor device according to an exemplary embodiment of the invention, in which a substrate is provided and an isolator is formed in the substrate.

FIG. 4A shows a first step of the method for manufacturing the semiconductor device according to the exemplary embodiment of the invention. In this step, there is provided a substrate 100 comprising a base layer 101, a first semiconductor layer 103, an insulating layer 104 and a second semiconductor layer 105 stacked sequentially. The first semiconductor layer 103 forms a first back gate electrode of a first back gate of a first transistor and a second back gate electrode of a second back gate of a second transistor, and the insulating layer 104 forms a first back gate dielectric of the first back gate of the first transistor and a second back gate dielectric of the second back gate of the second transistor.

In addition, in the step shown in FIG. 4A, an isolator 150 for isolating the first transistor and the second transistor from each other may further be formed in the substrate 100. The isolator 150 may, for example, be a shallow trench isolation (STI) or an LOCOS. The shallow trench isolation may, for example, cross through the second semiconductor layer 105, the insulating layer 104 and the first semiconductor layer 103. The depth of the shallow trench isolation may, for example, be in the range of about 100 nm to 1000 nm.

Figure 4B:
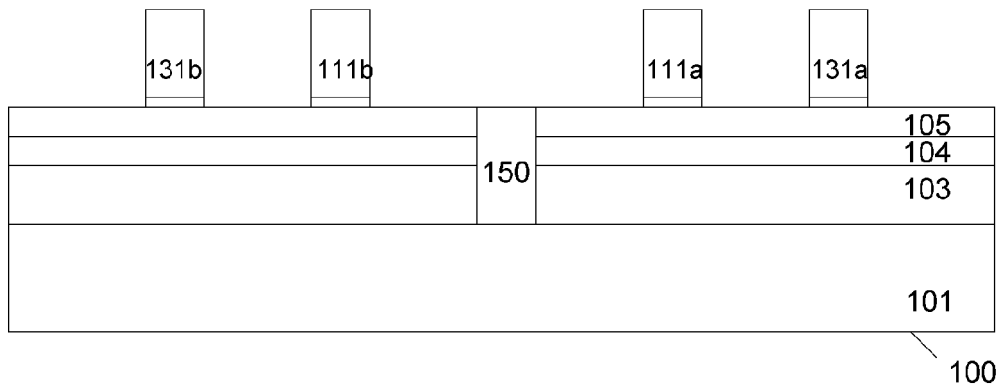
FIG. 4B shows the second step of a method for manufacturing the semiconductor device according to the exemplary embodiment of the invention, by which a first gate stack of a first transistor and a second gate stack of a second transistor are formed.

FIG. 4B shows a second step of the method for manufacturing the semiconductor device according to the exemplary embodiment of the invention. As shown in FIG. 4B, a first gate stack 111a and a second gate stack 111b are formed on the second semiconductor layer 105.

Optionally, in this step, a first dummy gate stack 131a and a second dummy gate stack 131b may further be formed on the second semiconductor layer 105.

In an example, the first gate stack 111a and the second gate stack 111b as well as the first dummy gate stack 131a and the second dummy gate stack 131b may be formed by depositing a dielectric layer and an electrode layer on the second semiconductor layer 105 of the substrate 100 sequentially, and then patterning the deposited electrode layer and dielectric layer. However, the invention is not limited to this. The gate stacks and the dummy gate stacks may also be formed by other methods known to those skilled in the art.

Figure 4C:
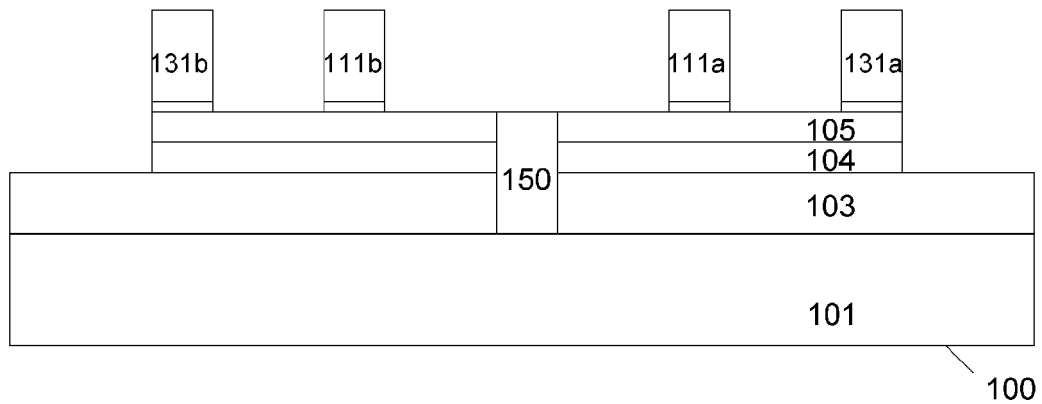
FIG. 4C shows a third step of the method for manufacturing the semiconductor device according to the exemplary embodiment of the invention, by which a portion of a first back gate electrode of the first transistor and a portion of a second back gate electrode of the second transistor are exposed.

FIG. 4C shows a third step of the method for manufacturing the semiconductor device according to the exemplary embodiment of the invention. As shown in FIG. 4C, a portion of the second semiconductor layer 105 and a portion of the insulating layer 104 are selectively removed to expose a portion of the first back gate electrode and a portion of the second back gate electrode. As will be described in the following, in a subsequent step, a first back gate contact and a second back gate contact will be formed on the exposed portion of the first back gate electrode and the exposed portion of the second back gate electrode, respectively.

In an example, a portion of the second semiconductor layer 105 and a portion of the insulating layer 104 may be selectively removed by etching. For example, a portion of the first back gate electrode and a portion of the second back gate electrode may be exposed by masking the portions of the second semiconductor layer 105 and the insulating layer 104 that need not be removed using a mask, performing an exposure process, and then etching away the portion which is subjected to the exposure process. However, the invention is not limited to this. A portion of the second semiconductor layer 105 and a portion of the insulating layer 104 may also be selectively removed by other methods known to those skilled in the art.

Figure 4D:
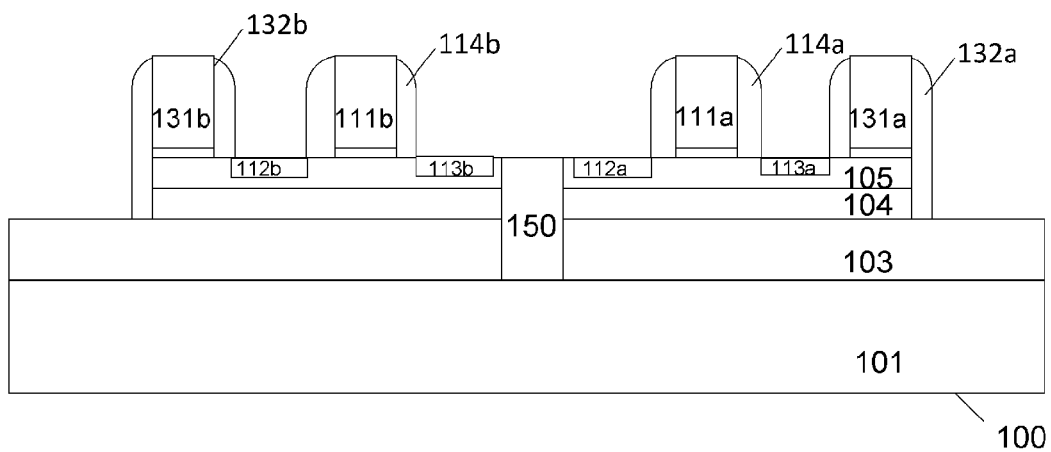
FIG. 4D shows a fourth step of the method for manufacturing the semiconductor device according to the exemplary embodiment of the invention, by which a first source region and a first drain region of the first transistor are formed, and a second source region and a second drain region of the second transistor are formed.

FIG. 4D shows a fourth step of the method for manufacturing the semiconductor device according to the exemplary embodiment of the invention. As shown in FIG. 4D, a first source region 112a and a first drain region 113a are formed on both sides of the first gate stack 111a, respectively, and a second source region 112b and a second drain region 113b are formed on both sides of the second gate stack 111b, respectively.

Optionally, spacers 114a and 114b may be formed on sidewalls of the first gate stack 111a and the second gate stack 111b, respectively, before forming the source region and the drain region. The spacers 114a and 114b may comprise a nitride, e.g., $Si_3N_4$. The spacers 114a and 114b may also comprise an oxide, e.g., $SiO_2$. In an example in which the first dummy gate stack 131a and the second dummy gate stack 131b are formed on the second semiconductor layer 105, spacers 132a and 132b may also be formed on sidewalls of the first dummy gate stack 131a and sidewalls of the second dummy gate stack 131b, respectively, at the same time when forming the spacers 114a and 114b.

In an example, the first source region 112a and the first drain region 113a as well as the second source region 112b and the second drain region 113b may be formed by implanting ions into the second semiconductor layer 105 on both sides of the first gate stack 111a and both sides of the second gate stack 111b. For an N-channel transistor such as an NFET, the ions implanted may, for example, be arsenic or phosphor, and for a P-channel transistor such as a PFET, the ions implanted may, for example, be boron. However, the invention is not limited to this. The source region and the drain region may also be formed by other methods known to those skilled in the art.

Figure 4E:
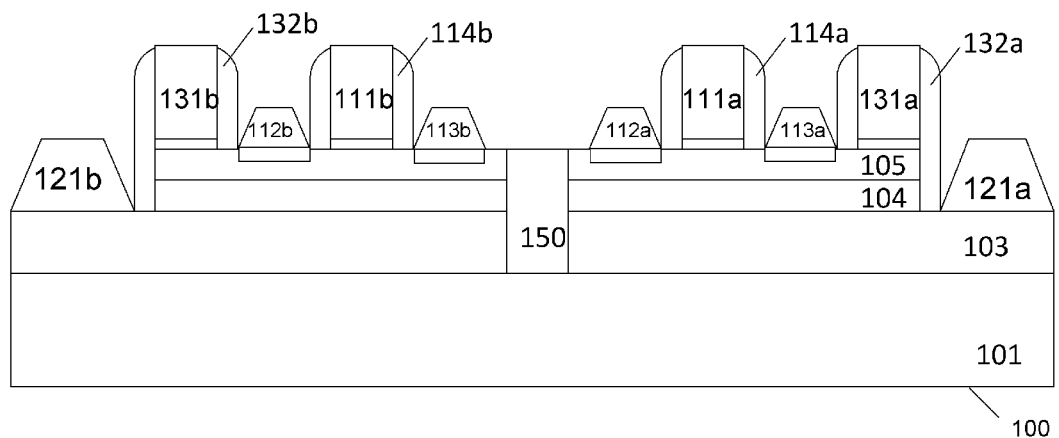
FIG. 4E shows a fifth step of the method for manufacturing the semiconductor device according to the exemplary embodiment of the invention, in which a selective epitaxy is performed to the exposed portion of the first back gate electrode, the exposed portion of the second back gate electrode, the first source region, the first drain region, the second source region and the second drain region.

FIG. 4E shows a fifth step of the method for manufacturing the semiconductor device according to the exemplary embodiment of the invention. In this step, a selective epitaxy is performed to the exposed portion of the first back gate electrode, the exposed portion of the second back gate electrode, the first source region 112a, the first drain region 113a, the second source region 112b and the second drain region 113b, to form an epitaxial part raised from the surface of the first back gate electrode and thus form a first back gate contact 121a, and form an epitaxial part raised from the surface of the second back gate electrode and thus form a second back gate contact 121b, such that each of the first source region 112a, the first drain region 113a, the second source region 112b and the second drain region 113b comprises an epitaxial part raised from the surface of the second semiconductor layer 105. In other words, the first source region and the first drain region of the first transistor, the second source region and the second drain region of the second transistor, as well as the exposed portion of the first back gate electrode and the exposed portion of the second back gate electrode are raised by the selective epitaxy.

A semiconductor device according to the exemplary embodiment of the invention is formed by the manufacturing method shown in FIGS. 4A to 4E, which comprises a first transistor and a second transistor. Each of the first transistor and the second transistor comprises a back gate contact formed on a portion of its back gate electrode, and the back gate contact comprises an epitaxial part raised from the surface of the back gate electrode. In such a manufacturing method, the formed structures (e.g., the buried insulating layer in the substrate) may be protected from damage during the formation of the back gate contact, and there is no need for an additional protective layer and an additional polysilicon filling. This greatly simplifies the manufacturing process and significantly reduces the cost of manufacture.

It should be noted that although the formation of two transistors is illustrated in the exemplary method for manufacturing the semiconductor device shown in FIGS. 4A to 4E, this is only an example and does not intend to limit the invention. The number of transistors comprised in the semiconductor device of the invention is not limited to two. The number of transistors comprised in the semiconductor device may be selected as desired by those skilled in the art.

In an example, one of the first transistor and the second transistor may be an N-type field effect transistor, while the other of the first transistor and the second transistor may be a P-type field effect transistor. The N-type field effect transistor and the P-type field effect transistor may be formed by the CMOS process, for example.

Figure 4F:
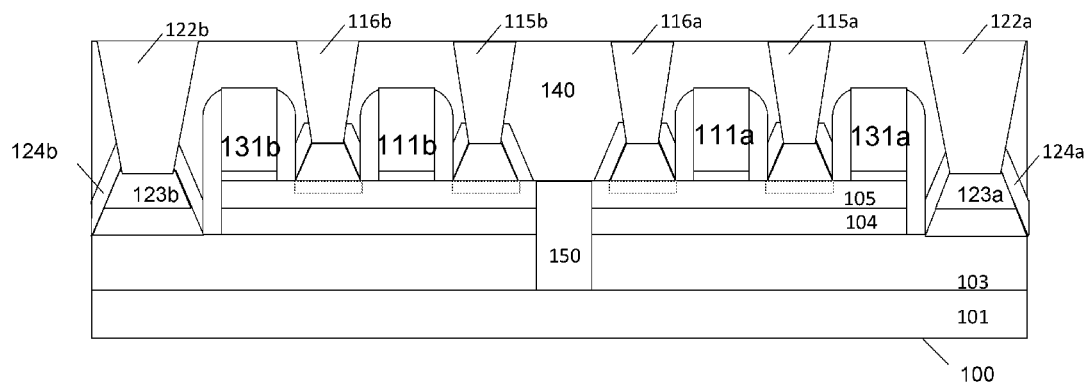
FIG. 4F shows an optional sixth step of the method for manufacturing the semiconductor device according to the exemplary embodiment of the invention, in which a first back-gate contact plug of the first transistor and a second back-gate contact plug of the second transistor are formed.

Optionally, the method for manufacturing a semiconductor device according to an exemplary embodiment of the invention may further comprise a step shown in FIG. 4F. In this step, a first back-gate contact plug 122a and a second back-gate contact plug 122b may further be formed on the first back gate contact and the second back gate contact, respectively. In an example, the first and second back-gate contact plugs may be formed in a passivation layer 140 above the first and second back gate contacts. The first and second back-gate contact plugs may comprise metals. For example, the first and second back-gate contact plugs may comprise tungsten, copper, aluminum, etc.

Optionally, before forming the first back-gate contact plug 122a and the second back-gate contact plug 122b, metal silicides 123a and 123b may be formed in the raised epitaxial part of the first back gate contact and the raised epitaxial part of the second back gate contact, respectively. The metal silicides 123a and 123b may, for example, be formed in a portion of the raised epitaxial parts of the back gate contacts. Furthermore, optionally, liners 124a and 124b may be formed on the outer surface of the raised epitaxial part of the first back gate contact and the outer surface of the raised epitaxial part of the second back gate contact, respectively. The liners may, for example, comprise a nitride.

Optionally, in the step shown in FIG. 4F, a first source region contact plug 116a, a first drain region contact plug 115a, a second source region contact plug 116b and a second drain region contact plug 115b may further be formed on the raised epitaxial part of the first source region and the raised epitaxial part of the first drain region of the first transistor as well as the raised epitaxial part of the second source region and the raised epitaxial part of the second drain region of the second transistor, respectively. In addition, the raised epitaxial parts of the source regions and the raised epitaxial parts of the drain regions may also comprise a metal silicide. Moreover, a liner may be optionally formed on the outer surfaces of the raised epitaxial parts of the source regions and the outer surfaces of the raised epitaxial parts of the drain regions, respectively.

While the exemplary embodiments of the invention have been described in detail with reference to the drawings, such a description should be considered illustrative or exemplary and not restrictive, and the invention is not limited to the disclosed embodiments. Various embodiments described in the above and the claims may also be combined. Variations to the disclosed embodiments can be understood and effected by those skilled in the art in practicing the claimed invention from a study of the drawings, the disclosure and the appended claims, and such variations also fall into the protective scope of the invention.

In the claims, the word "comprising" does not exclude the presence of other elements or steps, and the indefinite article "a" or "an" does not exclude a plurality of elements. The mere fact that certain means are recited in different dependent claims does not indicate that any combination of these means cannot be used advantageously.

The invention claimed is:

1. A transistor comprising:
   a substrate comprising at least a base layer, a first semiconductor layer, an insulating layer and a second semiconductor layer stacked sequentially;
   a gate stack formed on the second semiconductor layer;
   a source region and a drain region located on both sides of the gate stack, respectively;
   a back gate comprising a back gate dielectric and a back gate electrode formed by the insulating layer and the first semiconductor layer, respectively; and
   a back gate contact formed on a portion of the back gate electrode,
   wherein the back gate contact comprises an epitaxial part raised from the surface of the back gate electrode, and each of the source region and the drain region comprises an epitaxial part raised from the surface of the second semiconductor layer,
   wherein the back gate contact is isolated from the source region and the drain region by a dummy gate.

2. The transistor according to claim 1, wherein the substrate further comprises a further insulating layer located between the base layer and the first semiconductor layer.

3. The transistor according to claim 1, wherein the dummy gate comprises a dummy gate stack, and a spacer is formed on sidewalls of the dummy gate stack.

4. The transistor according to claim 1, wherein a spacer is formed on sidewalls of the gate stack.

5. The transistor according to claim 1, wherein a back-gate contact plug is formed on the back gate contact.

6. The transistor according to claim 5, wherein the raised epitaxial part of the back gate contact comprises a metal silicide.

7. The transistor according to claim 6, wherein a liner is formed on the outer surface of the raised epitaxial part of the back gate contact.

8. A semiconductor device comprising a plurality of transistors according to claim 1.

9. The semiconductor device according to claim 8, wherein the plurality of transistors comprises at least one N-type field effect transistor and at least one P-type field effect transistor, and the at least one N-type field effect transistor and the at least one P-type field effect transistor are isolated from each other by isolators.

10. The semiconductor device according to claim 9, wherein the isolator is a shallow trench isolation.

11. A method for manufacturing a transistor, comprising:
providing a substrate, the substrate comprising at least a base layer, a first semiconductor layer, an insulating layer and a second semiconductor layer stacked sequentially, wherein a back gate electrode and a back gate dielectric of a back gate of the transistor are formed by the first semiconductor layer and the insulating layer, respectively;
forming a gate stack on the second semiconductor layer;
selectively removing a portion of the second semiconductor layer and a portion of the insulating layer to expose a portion of the back gate electrode;
forming a source region and a drain region on both sides of the gate stack, respectively; and
performing a selective epitaxy to the exposed portion of the back gate electrode, the source region and the drain region to form an epitaxial part raised from the surface of the back gate electrode, so as to form a back gate contact, such that each of the source region and the drain region comprises an epitaxial part raised from the surface of the second semiconductor layer,
wherein a dummy gate stack is further formed in the step of forming the gate stack.

12. The method for manufacturing a transistor according to claim 11, wherein the substrate further comprises a further insulating layer located between the base layer and the first semiconductor layer.

13. The method for manufacturing a transistor according to claim 11, wherein before the step of forming the source region and the drain region on both sides of the gate stack, respectively, the method further comprises forming a spacer on sidewalls of the gate stack and sidewalls of the dummy gate stack, respectively.

14. The method for manufacturing a transistor according to claim 11, wherein before the step of forming the source region and the drain region on both sides of the gate stack, respectively, the method further comprises forming a spacer on sidewalls of the gate stack.

15. The method for manufacturing a transistor according to claim 11, wherein after the step of performing a selective epitaxy to the exposed portion of the back gate electrode, the source region and the drain region, the method further comprises forming a back-gate contact plug on the back gate contact.

16. The method for manufacturing a transistor according to claim 15, wherein a metal silicide is formed in the raised epitaxial part of the back gate contact before the formation of the back-gate contact plug.

17. The method for manufacturing a transistor according to claim 16, wherein a liner is formed on the outer surface of the raised epitaxial part of the back gate contact after the formation of the metal silicide.

18. A method for manufacturing a semiconductor device, the semiconductor device comprising a first transistor and a second transistor, the method comprising:
providing a substrate, the substrate comprising at least a base layer, a first semiconductor layer, an insulating layer and a second semiconductor layer stacked sequentially, wherein a first back gate electrode of a first back gate of the first transistor and a second back gate electrode of a second back gate of the second transistor are formed by the first semiconductor layer, and a first back gate dielectric of the first back gate of the first transistor and a second back gate dielectric of the second back gate of the second transistor are formed by the insulating layer;
forming an isolator for isolating the first transistor and the second transistor from each other;
forming a first gate stack and a second gate stack on the second semiconductor layer;
selectively removing a portion of the second semiconductor layer and a portion of the insulating layer to expose a portion of the first back gate electrode and a portion of the second back gate electrode;
forming a first source region and a first drain region on both sides of the first gate stack, respectively, and forming a second source region and a second drain region on both sides of the second gate stack, respectively; and
performing a selective epitaxy to the exposed portion of the first back gate electrode, the exposed portion of the second back gate electrode, the first source region, the first drain region, the second source region and the second drain region, thereby forming an epitaxial part raised from the surface of the first back gate electrode and thus forming a first back gate contact, as well as forming an epitaxial part raised from the surface of the second back gate electrode and thus forming a second back gate contact, such that each of the first source region, the first drain region, the second source region and the second drain region comprises an epitaxial part raised from the surface of the second semiconductor layer,
wherein a first dummy gate stack and a second dummy gate stack are further formed in the step of forming the first gate stack and the second gate stack.

19. The method for manufacturing a semiconductor device according to claim 18, wherein the substrate further comprises a further insulating layer located between the base layer and the first semiconductor layer.

20. The method for manufacturing a semiconductor device according to claim 18, wherein the first transistor is an N-type field effect transistor, and the second transistor is a P-type field effect transistor.

21. The method for manufacturing a semiconductor device according to any one of claim 18, wherein the isolator is a shallow trench isolation which crosses through the second semiconductor layer, the insulating layer and the first semiconductor layer.

22. The method for manufacturing a semiconductor device according to claim 18, wherein before the step of forming the first source region and the first drain region as well as the second source region and the second drain region, the method further comprises forming a spacer on sidewalls of the first gate stack and the second gate stack as well as on sidewalls of the first dummy gate stack and the second dummy gate stack, respectively.

23. The method for manufacturing a semiconductor device according to claim 18, wherein before the step of forming the first source region and the first drain region as well as the second source region and the second drain region, the method further comprises forming a spacer on sidewalls of the first gate stack and sidewalls of the second gate stack, respectively.

24. The method for manufacturing a semiconductor device according to claim 18, wherein after the step of performing a selective epitaxy, the method further comprises forming a first back-gate contact plug and a second back-gate contact plug on the first back gate contact and the second back gate contact, respectively.

25. The method for manufacturing a semiconductor device according to claim 24, wherein a metal silicide is formed in the raised epitaxial part of the first back gate contact and the raised epitaxial part of the second back gate contact, respectively, before the formation of the first back-gate contact plug and the second back-gate contact plug.

26. The method for manufacturing a semiconductor device according to claim 25, wherein a liner is formed on the outer surface of the raised epitaxial part of the first back gate contact and the outer surface of the raised epitaxial part of the second back gate contact, respectively, after the formation of the metal silicide.

* * * * *